(12) United States Patent
Chujo et al.

(10) Patent No.: US 11,229,115 B2
(45) Date of Patent: Jan. 18, 2022

(54) WIRING BOARD AND ELECTRONIC DEVICE

(71) Applicant: Hitachi, Ltd., Tokyo (JP)

(72) Inventors: Norio Chujo, Tokyo (JP); Yutaka Uematsu, Tokyo (JP); Masayoshi Yagyu, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 16/758,463

(22) PCT Filed: Dec. 13, 2017

(86) PCT No.: PCT/JP2017/044746
§ 371 (c)(1),
(2) Date: Apr. 23, 2020

(87) PCT Pub. No.: WO2019/116468
PCT Pub. Date: Jun. 20, 2019

(65) Prior Publication Data
US 2020/0260570 A1 Aug. 13, 2020

(51) Int. Cl.
*H05K 1/02* (2006.01)
*H05K 1/11* (2006.01)

(52) U.S. Cl.
CPC .......... *H05K 1/0228* (2013.01); *H05K 1/0245* (2013.01); *H05K 1/113* (2013.01);
(Continued)

(58) Field of Classification Search
CPC .... H05K 1/0228; H05K 1/0245; H05K 1/113; H05K 2201/09409; H05K 2201/09609; H05K 2201/10189; H05K 1/114
See application file for complete search history.

(56) References Cited

U.S. PATENT DOCUMENTS 6,462,423 B1 * 10/2002 Akram .............. H01L 23/49822
257/666
6,787,710 B2 * 9/2004 Uematsu ................ H05K 1/115
174/255
(Continued)

FOREIGN PATENT DOCUMENTS

JP 2007-142307 A 6/2007
JP 2007-522679 A 8/2007
(Continued)

OTHER PUBLICATIONS

International Search Report (PCT/ISA/210) issued in PCT Application No. PCT/JP2017/044746 dated Mar. 20, 2018 with English translation (five pages).
(Continued)

*Primary Examiner* — Ishwarbhai B Patel
(74) *Attorney, Agent, or Firm* — Crowell & Moring LLP

(57) ABSTRACT

In a multilayer wiring board having through holes used in an electronic device, wiring is efficiently performed at high density while preventing crosstalk of differential signals. A wiring board includes: a plurality of pads arranged linearly at a predetermined pitch; a plurality of through holes arranged in parallel along an arrangement direction of the pads; and a wiring pattern connecting the pad to the through hole. Between the through holes connected to the pads which are connected to the ground via the wiring patterns, two through holes through which each of a pair of differential signals constituting a differential signal pair passes are provided such that a direction of a straight line connecting the two through holes is inclined to the arrangement direction of the pads.

10 Claims, 7 Drawing Sheets

(52) U.S. Cl.
CPC ............ *H05K 1/0219* (2013.01); *H05K 1/114* (2013.01); *H05K 2201/09409* (2013.01); *H05K 2201/09609* (2013.01); *H05K 2201/10189* (2013.01)

(56) References Cited

U.S. PATENT DOCUMENTS

| | | | |
|---|---|---|---|
| 6,972,380 B2 * | 12/2005 | Lee ...................... | H05K 1/0251 174/255 |
| 7,361,846 B2 * | 4/2008 | Chiang ............. | H01L 23/49838 174/260 |
| 8,183,466 B2 * | 5/2012 | Morlion ................. | H05K 1/114 174/261 |
| 2005/0201065 A1 | 9/2005 | Regnier et al. | |
| 2006/0185890 A1 * | 8/2006 | Robinson ............. | H05K 1/0216 174/255 |
| 2007/0130555 A1 | 6/2007 | Osaka | |
| 2013/0214397 A1 | 8/2013 | Kawai | |
| 2014/0293566 A1 | 10/2014 | Mizutani et al. | |
| 2015/0357760 A1 | 12/2015 | Aihara et al. | |
| 2015/0370748 A1 | 12/2015 | Wakayama et al. | |
| 2018/0070439 A1 * | 3/2018 | Charbonneau ....... | H05K 1/0251 |

FOREIGN PATENT DOCUMENTS

| | | |
|---|---|---|
| JP | 2013-172036 A | 9/2013 |
| JP | 2014-192416 A | 10/2014 |
| JP | 2016-6874 A | 1/2016 |
| WO | WO 2015/068225 A1 | 5/2015 |

OTHER PUBLICATIONS

Japanese-language Written Opinion (PCT/ISA/237) issued in PCT Application No. PCT/JP2017/044746 dated Mar. 20, 2018 (three pages).

* cited by examiner

[FIG. 1]
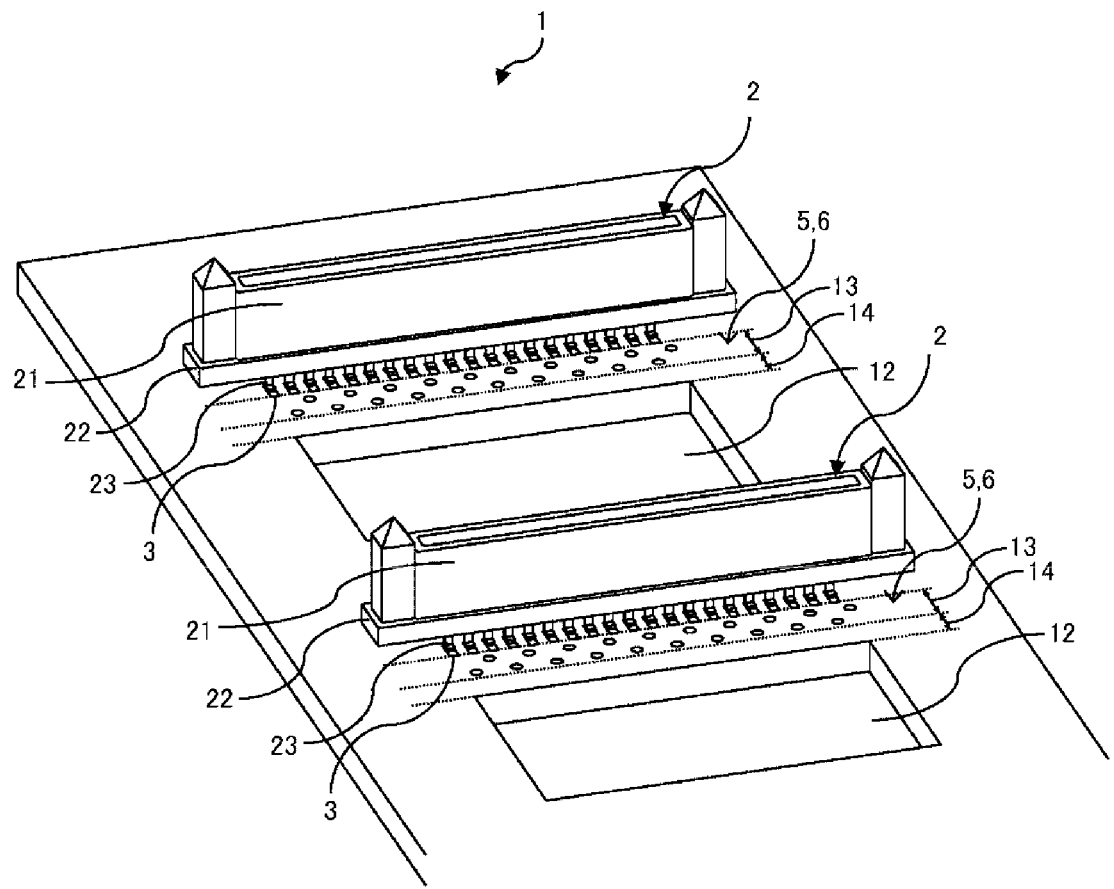

[FIG. 2]
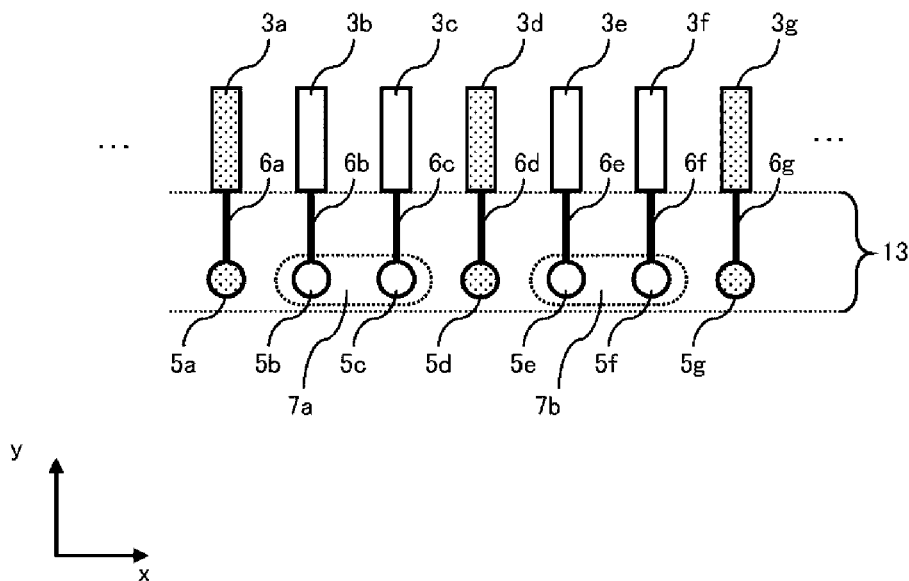
[FIG. 3]
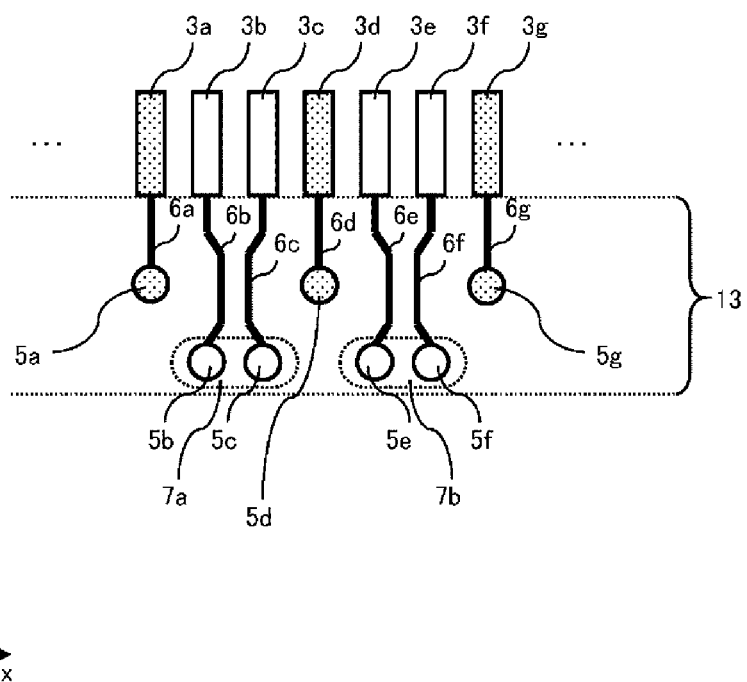

[FIG. 4]
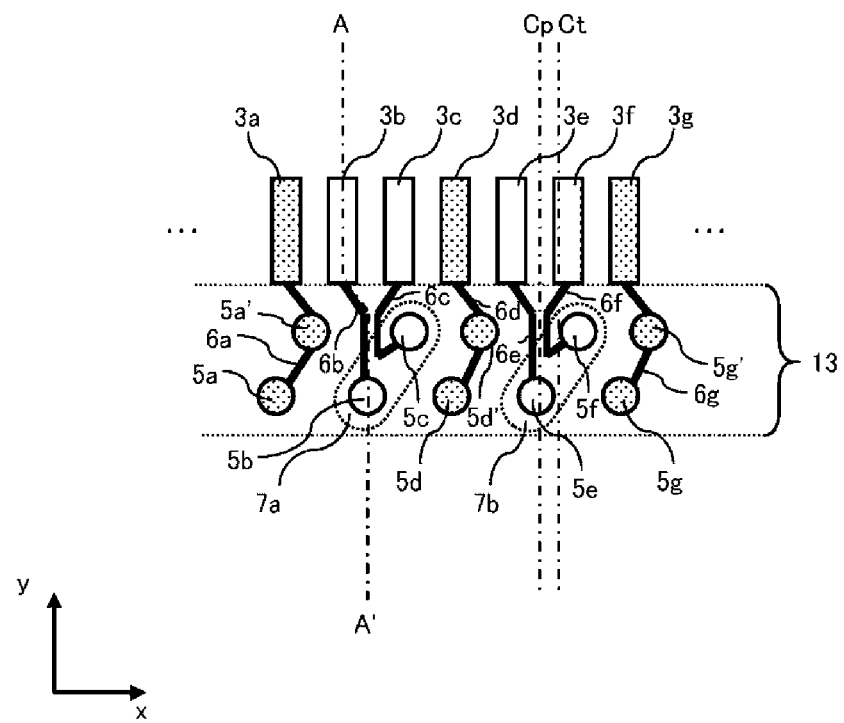
[FIG. 5]
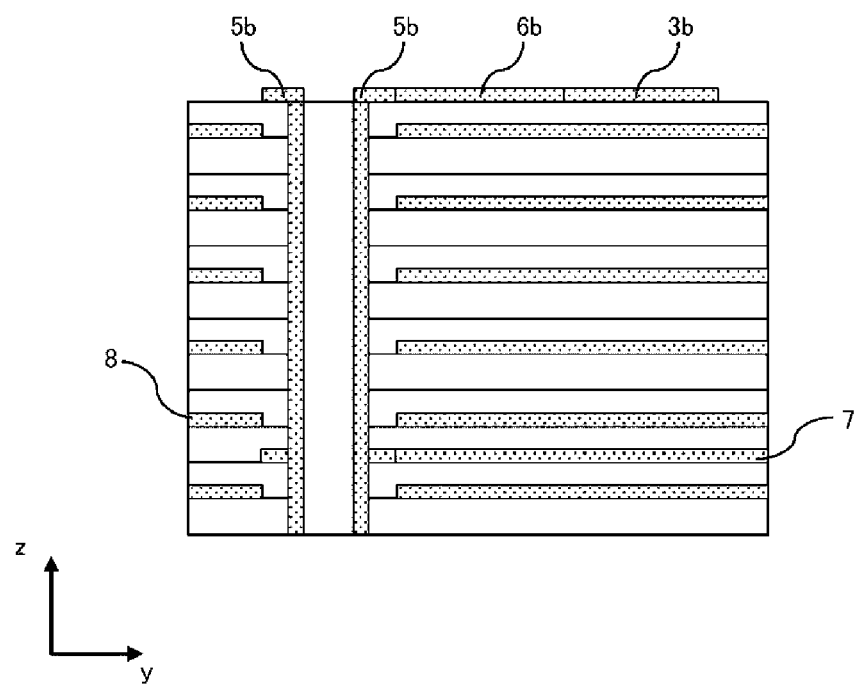

[FIG. 6]
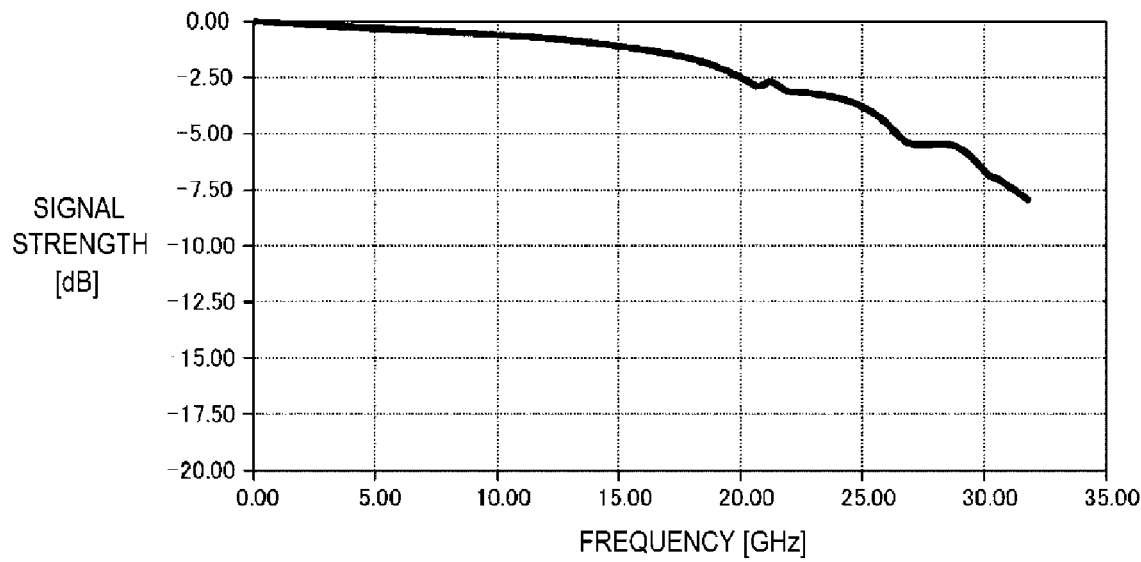
[FIG. 7]
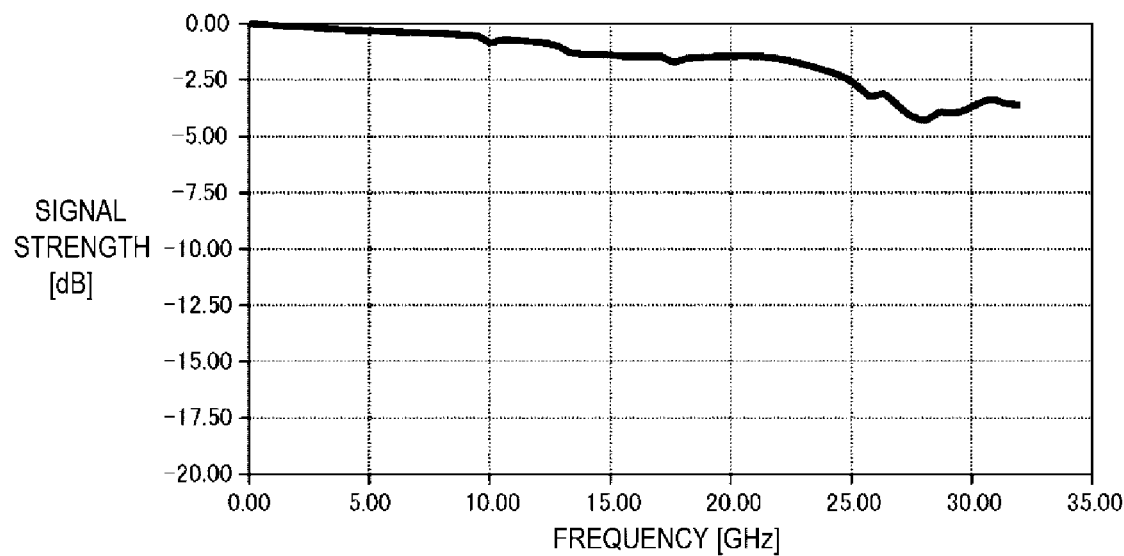

[FIG. 8]
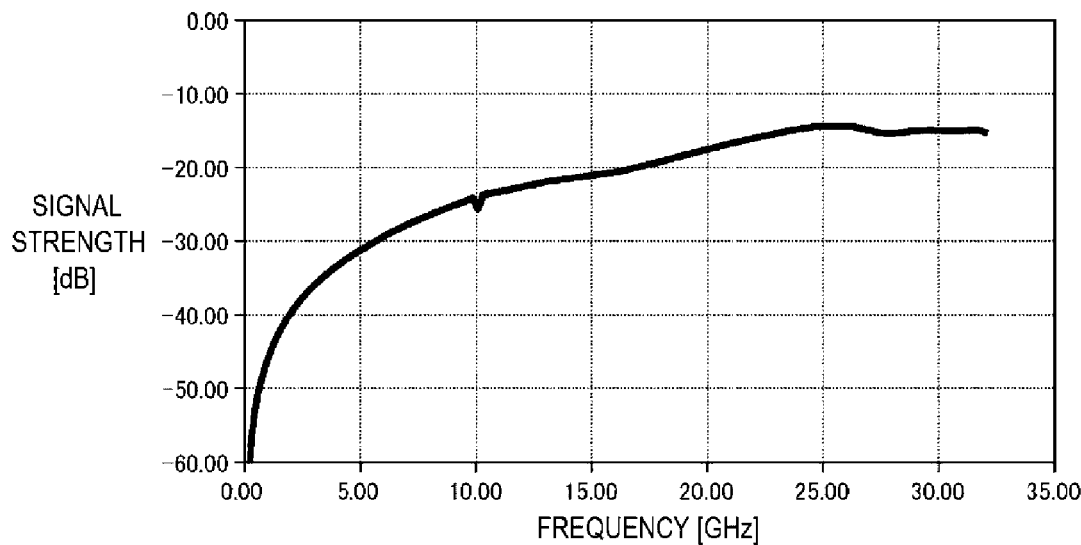
[FIG. 9]
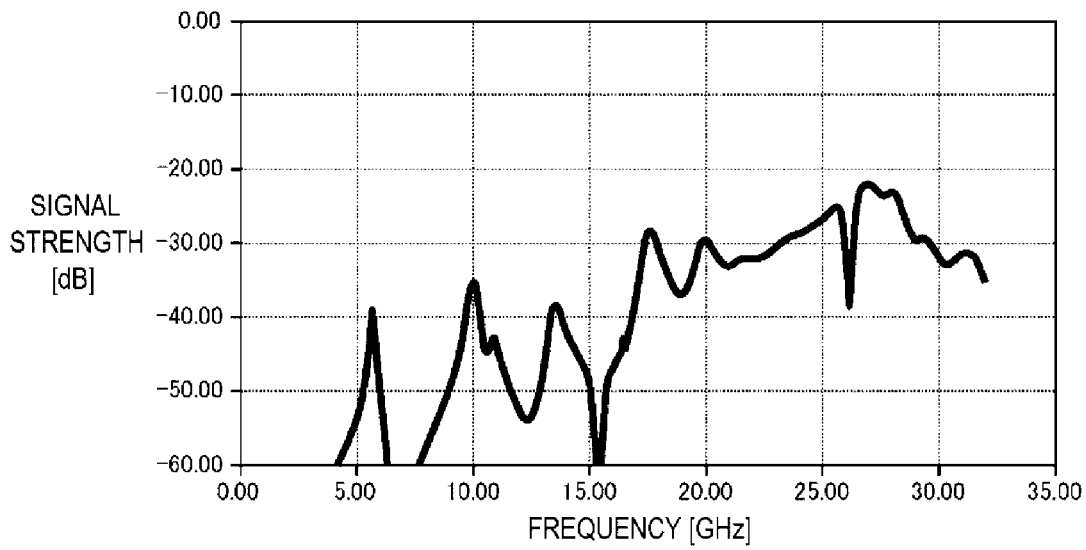

[FIG. 10]
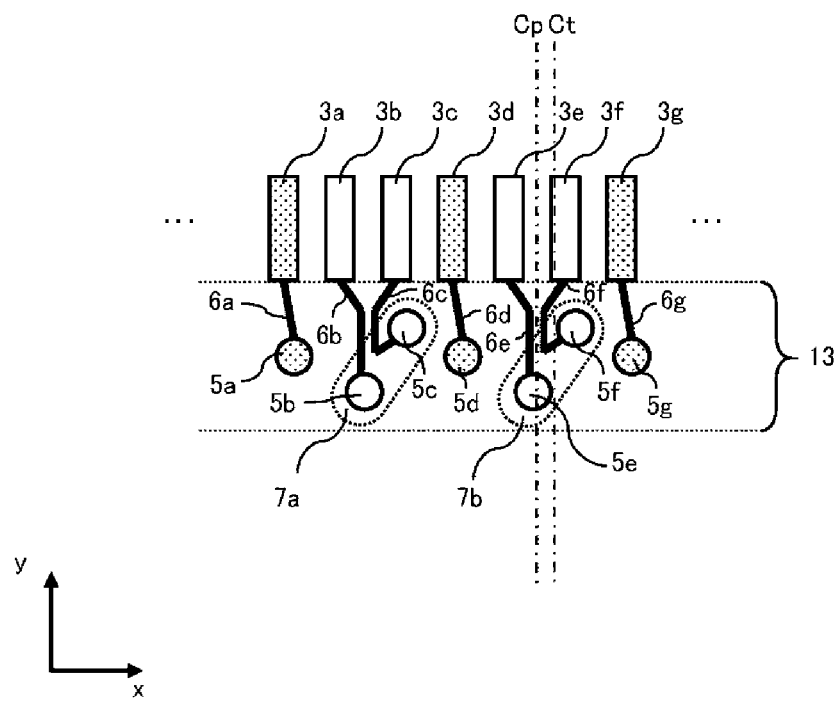
[FIG. 11]
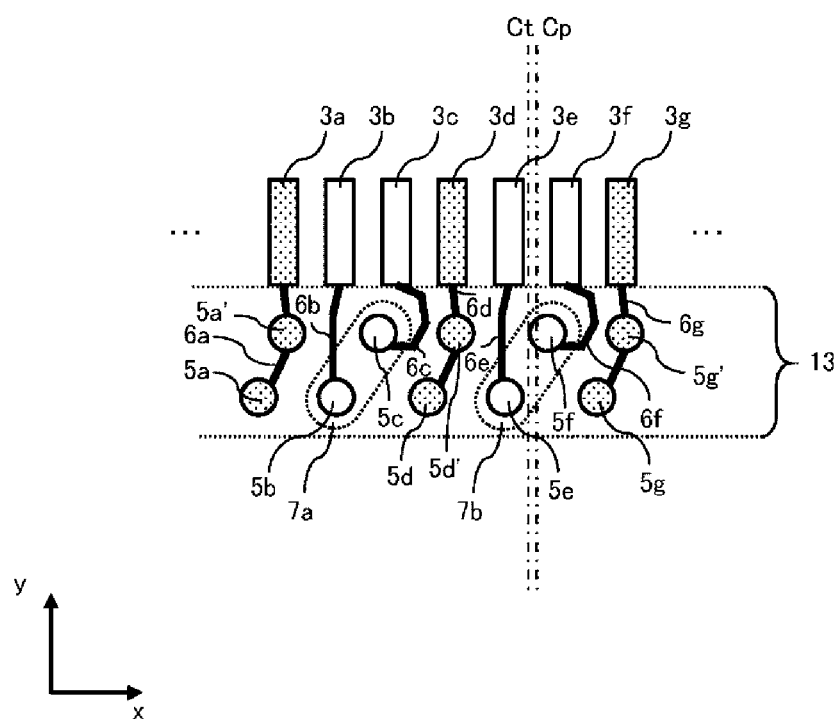

[FIG. 12]
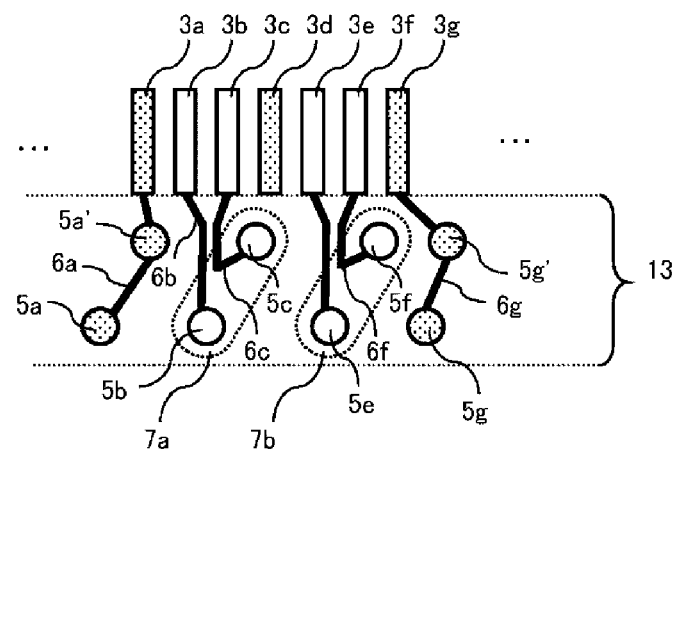

WIRING BOARD AND ELECTRONIC DEVICE

TECHNICAL FIELD

The present invention relates to a wiring board and an electronic device.

BACKGROUND ART

PTL 1 discloses that "when a high-speed differential signal is transmitted to a differential wiring through a via hole with an open stub, a waveform distortion occurs due to an impedance mismatch at the open stub of the via and causes a jitter, which is a problem of speed-up", and "for the differential wiring passing through the via hole with the open stub, a degree of coupling is reduced while a differential characteristic impedance is kept constant. Therefore, an influence of rear crosstalk noise due to the coupling can be reduced to a small value, so that the jitter can be prevented".

PTL 2 discloses that "Provided is a multilayer wiring board or the like which can reduce crosstalk between differential wirings disposed in each signal layer between ground layers", and "There is a multilayer wiring board 1 in which a plurality of signal layers 3 and ground layers 2 are laminated. The ground layer includes a first clearance 141 through which a first differential signal via 12A is inserted without coming into contact with a wiring of the ground layer, and a second clearance 142 through which a second differential signal via 12B is inserted without coming into contact with the wiring of the ground layer. A distance Rx between an outer edge portion of the first clearance on the side of the second differential signal via and the first differential signal via is set to be shorter than a distance Rmax between an outer edge portion of the first clearance on the side opposite to the second differential signal via and the first differential signal. A distance between an outer edge portion of the second clearance on the side of the first differential signal via and the second differential signal via is set to be shorter than the distance between the outer edge portion of the second clearance on the side opposite to the first differential signal via and the second differential signal via".

CITATION LIST

Patent Literature

PTL 1: JP-A-2007-142307
PTL 2: JP-A-2013-172036

SUMMARY OF INVENTION

Technical Problem

In an electronic device (blade server, storage device, and the like) configured by using a large number of electronic components such as an integrated circuit, a large number of signal lines and power supply lines, ground lines, and the like for electrically connecting the electronic components are required to be efficiently wired at high density, and a multilayer wiring board is used as a wiring board.

On the surface of the wiring board, there are provided a plurality of pads aligned at a predetermined pitch on which a multi-pin electronic component such as an integrated circuit or a surface mount connector is mounted and each pin is soldered. Each of a plurality of pads is electrically connected to a through hole that electrically connects layers of the wiring board via a wiring pattern.

In recent years, with the miniaturization of the device, the improvement of processing performance, and high-speed communication, and the like, a wiring board, which constitutes the electronic device, is required to be further miniaturized and improved in performance. However, in order to meet such a demand, it is necessary to deal with the following problems in the configuration of the wiring board.

First, since the electronic component cannot be mounted in a region where the through hole is disposed, it is necessary to make the region as small as possible in order to mount the electronic component at high density on the wiring board.

Further, although a differential signal is often used for the wiring board to improve the communication speed, it is necessary to prevent crosstalk in the signal line of the differential signal.

Further, in recent years, the electronic component having a narrow pitch of pins is frequently used in wiring boards in order to achieve miniaturization or ensure compatibility with existing interfaces, and a pitch of pads on the wiring board is also narrowed. On the other hand, since the through hole needs to be formed by drilling, it is difficult to reduce the diameter and ensure the accuracy of a hole position, and there is a limit to adjust an interval of the through holes according to the pitch of the pads.

Further, although an air hole for allowing cooling air to pass through may be provided in the wiring board accommodated in a housing of the electronic device, in this case, it is necessary to prevent an area of the air hole from being pressed by the through hole or the wiring pattern provided in the wiring board.

Here, in PTL 1, a power supply via hole and a signal via hole are linearly arranged in a drawing direction, and a region of the via hole inevitably becomes large. Further, the crosstalk may occur because the signal via holes are adjacent to each other in a direction perpendicular to the drawing direction.

In addition, in PTL 2, the vias are linearly arranged in a direction in which the differential wiring extends, and a region of the via inevitably becomes large. Also, there is a portion where the differential signal vias are adjacent to each other between the pair of adjacent differential signal vias, which may cause crosstalk.

The invention is made in view of such a background, and an object of the invention is to provide a wiring board capable of efficiently performing wiring at high density while preventing the crosstalk of the differential signals and an electronic device using the same.

Solution to Problem

In one aspect of the invention for achieving the above object, there is provided a multilayer wiring board, including a plurality of pads linearly arranged at a predetermined pitch; a plurality of through holes arranged in parallel along an arrangement direction of the pads; and a wiring pattern connecting the pad to the through hole. Between the through holes connected to the pads which are connected to the ground via the wiring patterns, two through holes through which each of a pair of differential signals constituting a differential signal pair passes are provided such that a direction of a straight line connecting the two through holes is inclined to the arrangement direction of the pads.

Other problems to be disclosed by the application and methods for solving the problems will become clarified by the description of embodiments for implementing the invention and drawings.

Advantageous Effect

According to the invention, it is possible to provide the wiring board capable of efficiently performing wiring at high density while preventing the crosstalk of the differential signals and the electronic device using the same.

BRIEF DESCRIPTION OF DRAWINGS

FIG. 1 is a diagram illustrating a schematic configuration of a wiring board.

FIG. 2 is a diagram illustrating a configuration of a first comparative example.

FIG. 3 is a diagram illustrating a configuration of a second comparative example.

FIG. 4 is a diagram illustrating a configuration of a first embodiment.

FIG. 5 is a partial cross-sectional view of the wiring board having the configuration of FIG. 4 taken along a line A-A' of FIG. 4.

FIG. 6 is a graph illustrating pass characteristics of a differential signal of the wiring board of the second comparative example.

FIG. 7 is a graph illustrating pass characteristics of a differential signal of the wiring board of the first embodiment.

FIG. 8 is a graph illustrating crosstalk of the wiring board of the second comparative example.

FIG. 9 is a graph illustrating crosstalk of the wiring board of the first embodiment.

FIG. 10 is a diagram illustrating a configuration of a second embodiment.

FIG. 11 is a diagram illustrating a configuration of a third embodiment.

FIG. 12 is a diagram illustrating a configuration of a fourth embodiment.

DESCRIPTION OF EMBODIMENTS

Hereinafter, embodiments of the invention will be described with reference to the drawings. Further, in the following description, the same or similar components are denoted by the same reference numerals, and a repetitive description thereof may be omitted.

FIG. 1 is a diagram illustrating a schematic configuration of a printed wiring board (hereinafter, referred to as a wiring board 1) according to an embodiment, and a perspective view of a part of the wiring board 1 as viewed from a surface side (+z side shown in FIG. 1). The wiring board 1 is, for example, a component of an electronic device such as a blade server or a storage device. The wiring board 1 is mounted as, for example, a midplane, a backplane, or the like in a housing of the electronic device. The wiring board 1 is a multilayer (laminated) wiring board having a multilayer (laminated) structure in which a plurality of layers such as a signal layer, a wiring layer, a power supply layer, and a ground layer are laminated. Further, note that the diagram only schematically illustrates a configuration of a surface of the wiring board 1, and the detailed configuration of the surface of the wiring board 1 will be clarified by the following description and other drawings.

A surface mounted multi-pin electronic component such as an integrated circuit or a surface mount connector is mounted on the surface of the wiring board 1. In the present embodiment, an example is described in which a plurality of board-to-board connectors (hereinafter, referred to as connectors 2) including a plurality of pins 23 are surface-mounted in parallel.

As shown in the figure, the connector 2 includes a socket 21 extending parallel to a lateral direction (x-axis direction) of the wiring board 1, and a pedestal portion 22 serving as a base of the socket 21. The pins 23 of the connector 2 are provided so as to be aligned along a longitudinal direction of the connector 2. Each pin 23 of the connector 2 extends downward (-z direction) from a lower surface of the pedestal portion 22 and an end portion thereof is bent in a direction (-y direction) away from the pedestal portion 22. For example, aboard (blade, card, or the like) on which electronic components such as an arithmetic unit and an I/O unit are mounted is mounted on the socket 21.

On the surface of the wiring board 1, there are provided a plurality of conductor pads (hereinafter, referred to as pads 3) linearly aligned in the lateral direction (x-axis direction) of the wiring board 1 with a pitch the same as the pitch of the pins 23 of the connector 2. The pads 3 are formed in a rectangular shape with the same shape and the same size having a longitudinal side parallel to a y-axis and a lateral side parallel to an x-axis. Each pin 23 of the connector 2 is soldered and electrically connected to the corresponding pad 3.

As shown in the figure, a rectangular air hole 12 for passing cooling air flowing inside the housing in which the wiring board 1 is accommodated is provided in a region sandwiched between two adjacent connectors 2 on the surface of the wiring board 1. The longitudinal side of the air hole 12 is parallel to the lateral direction (x-axis direction) of the wiring board 1, and the lateral side of the air hole 12 is parallel to the longitudinal direction (y-axis direction) of the wiring board 1. Further, the length of the longitudinal side of the air hole 12 is the same as the length of the connector 2 in the longitudinal direction.

In a region sandwiched between the plurality of pads 3 and the air holes 12, a substantially rectangular through hole forming region 13 is provided adjacent to the plurality of pads 3 arranged in alignment. A plurality of through holes 5 electrically connected to the corresponding pads 3 via wiring patterns 6 to be described later are formed in the through hole forming region 13. The through hole 5 is electrically connected to a predetermined layer of the wiring board 1.

As shown in the figure, a substantially rectangular region (hereinafter, referred to as a blank region 14) in which no through hole 5 is formed is provided between the through hole forming region 13 and the air hole 12. The blank region 14 is provided for, for example, ensuring strength of the wiring board 1.

Further, although only a structure of the -y side of the connector 2 is shown in FIG. 1, in the wiring board 1, the connector 2 has a similar structure on the +y side as the structure on the -y side (the pin 23, the pad 3, the through hole forming region 13, the blank region 14, or the like).

Next, several configuration examples (comparative examples and embodiments) of a periphery of the pads 3 and the through hole forming region 13 shown in FIG. 1 will be described in order.

FIG. 2 is a configuration example (hereinafter, referred to as a first comparative example) of the periphery of the pads 3 and the through hole forming region 13 shown in FIG. 1, and a plan view of a part of the periphery of the pads 3 and the through hole forming region 13 shown in FIG. 1 as viewed from the +z direction in FIG. 1.

In the figure, the pads 3b, 3c, 3e, and 3f shown in white are all pads through which a differential signal passes (hereinafter, also referred to as differential signal pads 3). The differential signal pad 3b and the differential signal pad 3c, the differential signal pad 3e and the differential signal pad 3f respectively constitute a differential signal pair (positive and negative signals constituting a pair of differential signals, hereinafter, referred to as a differential signal pair) in differential transmission. An example of the differential transmission complies with standards such as PCI Express (PCIe), universal serial bus (USB), serial ATA (SATA), High-Definition Multimedia Interface (registered trademark) (HDMI), Display Port, Ethernet (registered trademark), low voltage differential signaling (LVDS), or the like.

In the figure, the pads 3a, 3d, and 3g, which are shaded, are all ground pads (hereinafter, also referred to as ground pads 3).

In the figure, through holes 5b, 5c, 5e, and 5f shown in white are all through holes (hereinafter, also referred to as differential signal through holes 5) through which the differential signals pass. A signal passing through the differential signal through hole 5b and a signal passing through the differential signal through hole 5c, a signal passing through the differential signal through hole 5e and a signal passing through the differential signal through hole 5f respectively constitute the differential signal pair. As shown in the figure, clearances 7a and 7b for ensuring insulation are provided around two differential signal through holes 5 in each differential signal pair.

In the figure, the through holes 5a, 5d, and 5g, which are shaded, are all ground through holes (hereinafter, also referred to as ground through holes 5).

As shown in the figure, the plurality of pads 3 are electrically connected to the corresponding through holes 5 through the wiring patterns 6 made of a conductor such as a copper foil. That is, the pad 3a is electrically connected to the through hole 5a via a wiring pattern 6a, the pad 3b is electrically connected to the through hole 5b via a wiring pattern 6b, the pad 3c is electrically connected to the through hole 5c via a wiring pattern 6c, the pad 3d is electrically connected to the through hole 5d via a wiring pattern 6d, the pad 3e is electrically connected to the through hole 5e via a wiring pattern 6e, the pad 3f is electrically connected to the through hole 5f via a wiring pattern 6f, and the pad 3g is electrically connected to the through hole 5g via a wiring pattern 6g.

According to the first comparative example described above, the through holes 5a to 5g can be linearly arranged in the alignment direction of the pads 3 (x-axis direction), and the through hole forming region 13 can be made small. Therefore, it is possible to increase the area of the air hole 12 in the wiring board 1. As shown in the figure, since the ground through hole 5 is interposed between the differential signal through holes 5 of adjacent differential signal pairs, a crosstalk between the adjacent differential signal pairs can be prevented.

By the way, since the through hole 5 needs to be formed by drilling, it is difficult to reduce the diameter and ensure the accuracy of the hole position, and it is difficult to make a pitch of the through holes 5 narrower than a predetermined lower limit value. Therefore, when a pitch of the pins 23 of the connector 2 is narrow and a pitch of the pads 3 is narrow, the through holes 5a to 5g cannot be linearly arranged in parallel (in the x-axis direction) in the alignment direction of the pads 3 as in the first comparative example.

FIG. 3 is a configuration example of the periphery of the pads 3 and the through hole forming region 13 so as to be able to deal with a case where the pitch of the pads 3 is narrow (hereinafter, referred to as a second comparative example).

As shown in the figure, in the second comparative example, the through holes 5b, 5c, 5e, and 5f for differential signals are provided at positions on an air hole 12 side away from the pads 3 than the through holes 5a, 5d, and 5g for a ground line. According to the second comparative example, it is possible to deal with a case where the pitch of the pads 3 is narrow. However, since the position of the through holes 5b, 5c, 5e, and 5f for the differential signals approach the air hole 12, the through hole forming region 13 expands, and a region for forming the air hole 12 is compressed. Further, there is a possibility that crosstalk occurs between the adjacent differential signal pairs without the ground through hole interposed between the through holes 5 of two adjacent differential signal pairs.

FIG. 4 is a configuration example (hereinafter, referred to as a first embodiment) of the periphery of the pads 3 and the through hole forming region 13 for solving the above problem of the second comparative example.

As shown in the figure, in the first embodiment, an arrangement direction of the differential signal through holes 5 of the differential signal pair (a direction of a straight line connecting centers of the through holes 5 which form the differential signal pair) is inclined by a predetermined angle (for example, 10 to 80 degrees) to an arrangement direction (x-axis direction) of the pads 3. As shown in the figure, in the first embodiment, the ground through holes 5 are provided for each of the two differential signal through holes 5 of the differential signal pair, and each of the differential signal through holes 5 is located between the ground through holes 5 adjacent to each other in the arrangement direction (x-axis direction) of the pads 3. In the figure, for example, the differential signal through hole 5b is located between the ground through hole 5a and the ground through hole 5d, and the differential signal through hole 5c is located between the ground through hole 5a' and the ground through hole 5d'. Further, by setting the predetermined angle to, for example, 60 degrees, all of the differential signal through holes 5 and the ground through holes 5 can be arranged at equal intervals, and the through holes 5 can be arranged at high density in the wiring board 1.

Further, as shown in the figure, in the first embodiment, the differential signal through hole 5 is provided such that a center line Ct of the two differential signal through holes 5 constituting the differential signal pair is on the +x side (a differential signal pad 3 side connected to the differential signal through hole 5 located closer to the pad 3 among the two differential signal through holes 5 which constitute the differential signal pair) with respect to a center line Cp between two adjacent differential signal pads 3. Therefore, the lengths of the two wiring patterns 6 connected to the respective differential signal through holes 5 can be equal to each other. Therefore, the in-phase noise superimposed on the wiring of the differential signal is cancelled, and the transmission quality can be ensured.

According to the configuration of the first embodiment described above, since the differential signal through hole 5 is interposed between the ground through holes 5, the region for forming the air hole 12 is not compressed by the through hole forming region 13. Further, since the ground through hole 5 is interposed between the through holes 5 of the adjacent differential signal pairs, a reduction effect of the crosstalk between two adjacent differential signal pairs can be expected.

FIG. 5 is a view illustrating an internal structure of the wiring board 1 of FIG. 4, and is a partial cross-sectional view of the wiring board 1 of FIG. 4 taken along a line A-A'. As shown in the figure, the differential signal pad 3b is electrically connected to the differential signal wiring 7 of an inner layer via the wiring pattern 6b and the differential signal through hole 5b. Similarly, the other pads 3 are electrically connected to the predetermined layer via the corresponding wiring patterns 6 and the through holes 5, respectively.

FIG. 6 is a graph illustrating pass characteristics of the differential signal of the wiring board 1 of the second comparative example, and FIG. 7 is a graph illustrating pass characteristics of the differential signal of the wiring board 1 of the first embodiment. In both graphs, the horizontal axis represents frequency (GHz) and the vertical axis represents signal strength (dB). As shown in the figure, it can be seen that the differential signal characteristic in the first embodiment, particularly in a high frequency region, is improved as compared with the second comparative example.

FIG. 8 is a graph illustrating a frequency characteristic of crosstalk of the wiring board 1 of the second comparative example, and FIG. 9 is a graph illustrating a frequency characteristic of crosstalk of the wiring board 1 of the first embodiment. In both graphs, the horizontal axis represents frequency (GHz) and the vertical axis represents signal strength (dB). As shown in the figure, it can be seen that the crosstalk is reduced over the entire frequency in the first embodiment, as compared with the case of the second comparative example.

FIG. 10 is another configuration example (hereinafter, referred to as a second embodiment) of the periphery of the pads 3 and the through hole forming region 13 for solving the problem of the second comparative example.

In the first embodiment, two ground through holes 5 are provided between the differential signal through holes 5 of the adjacent differential signal pairs, but in the second embodiment, only one ground through hole 5 exists between the differential signal through holes 5 of the adjacent differential signal pairs. Further, the ground through hole 5 is provided near the middle of a line segment connecting the differential signal through hole 5 on the pad 3 side of one adjacent differential signal pair to the differential signal through hole 5 on the air hole 12 side of the other differential signal pair. In the figure, a ground through hole 5d is provided near the middle of a line segment connecting the differential signal through hole 5c to the differential signal through hole 5e. By providing the ground through holes 5 at such positions, even when only one ground through hole 5 exists between the differential signal through holes 5 of the adjacent differential signal pairs, it is possible to efficiently reduce the crosstalk between the adjacent differential signal pairs.

FIG. 11 is another configuration example (hereinafter, referred to as a third embodiment) of the periphery of the pads 3 and the through hole forming region 13 for solving the problem of the second comparative example.

In the first embodiment, the two differential signal through holes 5 of the differential signal pair are provided such that a center line Ct drawn in the y-axis direction between the two differential signal through holes 5 of the differential signal pair is on the +x side (a differential signal pad 3 side connected to the differential signal through hole 5 located closer to the pad 3 among the two differential signal through holes 5 which constitute the differential signal pair) with respect to a center line Cp drawn in the y-axis direction between the two adjacent differential signal pads 3. On the other hand, in the third embodiment, the two differential signal through holes 5 of the differential signal pair are provided such that the center line Ct is on the −x side (the differential signal pad 3 side connected to the differential signal through hole 5 which is located on the side farther from the pad 3 (the air hole 12 side) among the two differential signal through holes 5 which constitute the differential signal pair) with respect to the center line Cp.

As shown in the figure, also in the third embodiment, the wiring patterns 6 (for example, the wiring pattern 6b and the wiring pattern 6c) each connected to each of the pair of the differential signal through holes 5 may have the same length. Further, although in the first embodiment, there is a portion where two wiring patterns 6 exist between the ground through hole 5 and the differential signal through hole 5 (for example, two wiring patterns 6b and 6c exist between the ground through hole 5a' and the differential signal through hole 5c in FIG. 4), there is no such a portion in the third embodiment, and an interval between the wiring pattern 6 and the ground through hole 5 can be widened accordingly. Therefore, a capacitance between the ground through hole 5 and the differential signal through hole 5 can be reduced, a curvature of the wiring pattern 6 can be increased, and even when the differential signal is high, it is possible to prevent distortion of the waveform and perform high-quality signal transmission.

FIG. 12 is another configuration example (hereinafter, referred to as a fourth embodiment) of the periphery of the pads 3 and the through hole forming region 13 for solving the problem of the second comparative example.

In the fourth embodiment, the wiring pattern 6 connected to a part of the ground pads 3 and the ground through hole 5 connected to the wiring pattern 6 in the first embodiment are not provided. In the example of the figure, the wiring pattern 6d, the ground through hole 5d, and the ground through hole 5d' connected to the ground pad 3d in FIG. 4 are not provided.

In the fourth embodiment, the through hole 5 of each differential signal pair is provided such that the through hole 5 of the other differential signal pair is located on a perpendicular bisector of a line segment connecting two differential signal through holes 5 of one of the two adjacent differential signal pairs. In the figure, for example, the differential signal through hole 5c is located on a perpendicular bisector of a line segment connecting the differential signal through hole 5e and the differential signal through hole 5f (these three through holes 5 constitute the vertexes of a same equilateral triangle in this example). Thus, the reason why the through hole 5 of the other differential signal pair is located on the perpendicular bisector of the two differential signal through holes 5 of one differential signal pair is that an electromagnetic effect from the two through holes (effects of potential and magnetic field strength caused by the two through holes) is small on the plane including the perpendicular bisector of the two differential signal through holes 5 of the differential signal pair.

According to the fourth embodiment described above, even when a pitch of the pins 23 of the connector 2 is very narrow and a difference between the pitch of the through holes 5 and the lower limit value is large, a crosstalk between the differential signal through holes 5 of the adjacent differential signal pairs can be prevented, and the quality of the differential signal can be ensured.

REFERENCE SIGN LIST

1: wiring board
2: connector
12: air hole
13: through hole forming region
14: blank region
21: socket
22: pedestal portion
23: pin
3: pad (differential signal pad, ground pad)
5: through hole (differential signal through hole, ground through hole)
6: wiring pattern

The invention claimed is:

1. A multilayer wiring board comprising:
a plurality of pads arranged linearly in a predetermined pitch;
a plurality of through holes arranged in parallel along an arrangement direction of the plurality of pads; and
a wiring pattern connecting the plurality of pads to the plurality of through holes, wherein
between the plurality of through holes connected to the plurality of pads which are connected to the ground via the wiring patterns, two through holes through which each of a pair of differential signals constituting a differential signal pair passes are provided such that a direction of a straight line connecting a center the two through holes is inclined to the arrangement direction of the plurality of pads, and
the two through holes through which each of a pair of differential signals constituting a differential signal pair passes, are located immediately adjacent to a first wiring pattern having two ground through holes and to a second wiring pattern having two ground through holes.

2. The wiring board according to claim 1, wherein
each of the two through holes through which each of the pair of differential signals passes is connected to each of the two pads provided adjacent to each other in the arrangement direction via the wiring pattern, and
the two through holes are provided such that a straight line passing through a midpoint of the straight line connecting the two through holes and perpendicular to the arrangement direction is located at a pad side which is connected to the through hole on the side closer to the pad among the two through holes with respect to a center line passing through a middle point of the arrangement direction of the two pads and perpendicular to the arrangement direction.

3. The wiring board according to claim 1, wherein
the through holes connected to the ground are provided to be adjacent to the arrangement direction of the pads with respect to the through holes through which the differential signal passes.

4. The wiring board according to claim 1, wherein
the two through holes of each of a plurality of differential signal pairs are arranged in parallel along the arrangement direction of the pads with the through hole connected to the ground therebetween, and
the through hole connected to the ground and provided between two adjacent differential signal pairs is located near a midpoint of a line segment connecting the through hole located on the pad side of two through holes of one of the two adjacent differential signal pairs to the through hole located on a side away from the pad of two through holes of another of the two adjacent differential signal pairs.

5. The wiring board according to claim 1, wherein
each of the two through holes through which each of the pair of differential signals passes is connected to each of the two pads provided adjacent to each other in the arrangement direction via the wiring pattern, and
the two through holes are provided such that a straight line passing through a midpoint of the straight line connecting the two through holes and perpendicular to the arrangement direction is at a pad side which is connected to the through hole located on the side farther from the pad among the two through holes with respect to a center line passing through a middle point of the arrangement direction of the two pads and perpendicular to the arrangement direction.

6. The wiring board according to claim 1, wherein
a pair of pads to which two of the through holes of the differential signal pair are connected, and the pad connected to the ground are alternately provided along the arrangement direction, and
a part of the pad connected to the ground is not provided with the through hole serving as an access point of the pad.

7. The wiring board according to claim 6, wherein
the through holes of the differential signal pair is provided such that the through hole of the other differential signal pair is located on a perpendicular bisector of the line segment connecting two through holes of the one differential signal pair among the two adjacent differential signal pairs.

8. The wiring board according to claim 7, wherein
among two adjacent differential signal pairs, two through holes of one differential signal pair and one through hole of the other differential signal pair are provided so as to form vertexes of the same regular triangle.

9. An electronic device comprising:
a multilayer wiring board including:
a plurality of pads arranged linearly at a predetermined pitch;
a plurality of through holes arranged in parallel along an arrangement direction of the plurality of pads; and
a wiring pattern connecting the plurality of pads to the plurality of through holes, wherein
between the plurality of through holes connected to the plurality of pads which are connected to the ground via the wiring patterns, two through holes through which each of a pair of differential signals constituting a differential signal pair passes are provided such that a direction of a straight line connecting a center of the two through holes is inclined to the arrangement direction of the plurality of pads, and
the two through holes through which each of a pair of differential signals constituting a differential signal pair passes, are located immediately adjacent to a first wiring pattern having two ground through holes and to a second wiring pattern having two ground through holes.

10. The electronic device according to claim 9, wherein
each of the two through holes through which each of the pair of differential signals passes is connected to each of the two pads provided adjacent to each other in the arrangement direction via the wiring pattern, and the two through holes are provided such that a straight line passing through a midpoint of the straight line connecting the two through holes and perpendicular to the arrangement direction is at a pad side which is connected to the through hole located on the side closer to the pad among the two through holes with respect to a center line passing through a middle point of the arrangement direction of the two pads and perpendicular to the arrangement direction.

\* \* \* \* \*